United States Patent [19]
Chooi et al.

[11] Patent Number: 6,039,512
[45] Date of Patent: Mar. 21, 2000

[54] FEEDER SYSTEM AND METHOD FOR SUPPLYING ELECTRICAL COMPONENTS TO A PICKUP LOCATION

[76] Inventors: Kon Hing Chooi, 50 Lintang Bukit Kecil 3; Ka Tiek Lim, 27 Jalan Sungai Ara 4 Taman Sungai Ara Bayan Lepas, both of Penang, Malaysia, 11900; Ping Chow Teoh, 123, Taman Mahawangsa, SBG Jalan Putra, Alor Setar, Kedah, Malaysia, 05150

[21] Appl. No.: 08/933,190

[22] Filed: Sep. 18, 1997

[51] Int. Cl.$^7$ .......................... B65G 53/66; B65G 53/04; B65G 53/34

[52] U.S. Cl. .............................. 406/85; 406/94; 406/137; 406/192; 406/194

[58] Field of Search .................................. 406/85, 86, 88, 406/93, 94, 95, 137, 192, 194; 221/278

[56] References Cited

U.S. PATENT DOCUMENTS 5,570,812  11/1996  Ando et al. .......................... 406/88 X Primary Examiner—Christopher P. Ellis
Assistant Examiner—Kenneth W Bower
Attorney, Agent, or Firm—Dale W. Dorinski

[57] ABSTRACT

A feeder system (1) and method supplies electrical components (20) to a pick-and-place machine (14). The feeder system (1) has a hopper (2) coupled by a passage (4) to a pickup location (3). The electrical components (20) are provided by air blasts to a first air outlet (6a) associated with the hopper (2) to agitate the components (20). Air blasts are concurrently supplied to a second and third air outlets (6b, 6c) located in the passage (6b) to thereby retain at least some of the components (20) therebetween. The third air outlet (6c) is disposed between the pickup location (3) and the second air outlet (6b) and in use an air blast from said third air outlet (6c) is effected immediately before an air blast from said second outlet (6b) is effected.

10 Claims, 2 Drawing Sheets

FEEDER SYSTEM AND METHOD FOR SUPPLYING ELECTRICAL COMPONENTS TO A PICKUP LOCATION

FIELD OF THE INVENTION

This invention relates to a feeder system and method for supplying electrical components to a pickup location. The invention is particularly useful for, but not necessarily limited to, supplying surface mountable electrical components, stored in hoppers, to pickup locations for subsequent mounting to a circuit board.

BACKGROUND OF THE INVENTION

Component feeding is a well-known process in Surface Mounting Technology (SMT). In general, a feeder is used to sequentially supply surface mountable electrical components to a pickup location for subsequent placing, by a pick-and-place machine, onto a printed circuit board (PCB) which is pre-printed with solder paste.

One form of feeder is a tape and reel feeder in which the electrical components are packaged on a tape that is wound onto a reel. The tape comprises individual pockets each containing one of the electrical components that are individually sealed in the pockets by a covering of thin film. In use, the film is removed when the tape enters the pickup location therefore leaving a pocket containing one of the electrical components in a position accessible by the pick-and-place machine. Unfortunately, the tape is substantially wider than the components located in the pockets that increases the width of the feeder. Further, the reel and apparatus for removing the film also add to the width and overall size of the feeder.

Hopper feeders also known as bulk or tube feeders are an alternative to tape and reel feeders. Hopper feeders comprise a hopper in communication, along a downwardly sloping passage, with the pickup location. The downwardly sloping passage makes use of gravity for supplying the components to the pickup location. To further assist the supplying of the components to the pickup location a combination of gravity and air blasting has also been used.

The pickup location has an abutment wall and an aperture. The abutment wall abuts the components supplied from the hopper before they are removed, through the aperture, by the pick-and-place machine. The supply of components to the pickup location must be controlled, otherwise undesirable amounts of friction between the abutment wall and an abutting component can result. This friction is due to a mass of stacked components in the downwardly sloping passage pushing the abutting components into the abutment wall. Accordingly, this friction may cause problems when the pick-and-place machine attempts to remove the abutting component. Further, unnecessary friction between the abutting component and an adjacent component can further hinder the removal of the abutting component.

In order to reduce the friction described above, the supply of components to the pickup location is mechanically controlled to separate components in the downwardly sloping passage from a component in the pickup location. For example, one conventional approach is to use a pneumatically controlled slotted disk located horizontally in series between the pickup location and sloping passage. The slotted disk has two diametrically opposite slots for sequentially engaging a component. The disk rotates through 180 degrees in a timed sequence to thereby transport an individual component, engaged in one of the slots, from the passage to the pickup location.

The above conventional mechanically controlled component separation approach requires valuable limited space. This is primarily due to the disk being substantially larger than the components and for practical reasons it is located horizontally therefore increasing the width of the feeder. In order to overcome this disadvantage, PCT/US97/04856 describes a feeder having an upwardly inclined portion which is upwardly inclined towards pick up location. This therefore reduces friction between the abutment wall and abutting components due to a mass of stacked components. However, there is still a need to reduce this friction further to allow ease of removal the abutting component.

BRIEF DESCRIPTION OF THE DRAWINGS

In order that the invention may be readily understood and put into practical effect, reference will now be made to a preferred embodiment illustrated in the accompanying drawings in which.

DETAILED DESCRIPTION OF THE PREFERRED EMBODIMENT OF THE INVENTION

Figure 1:
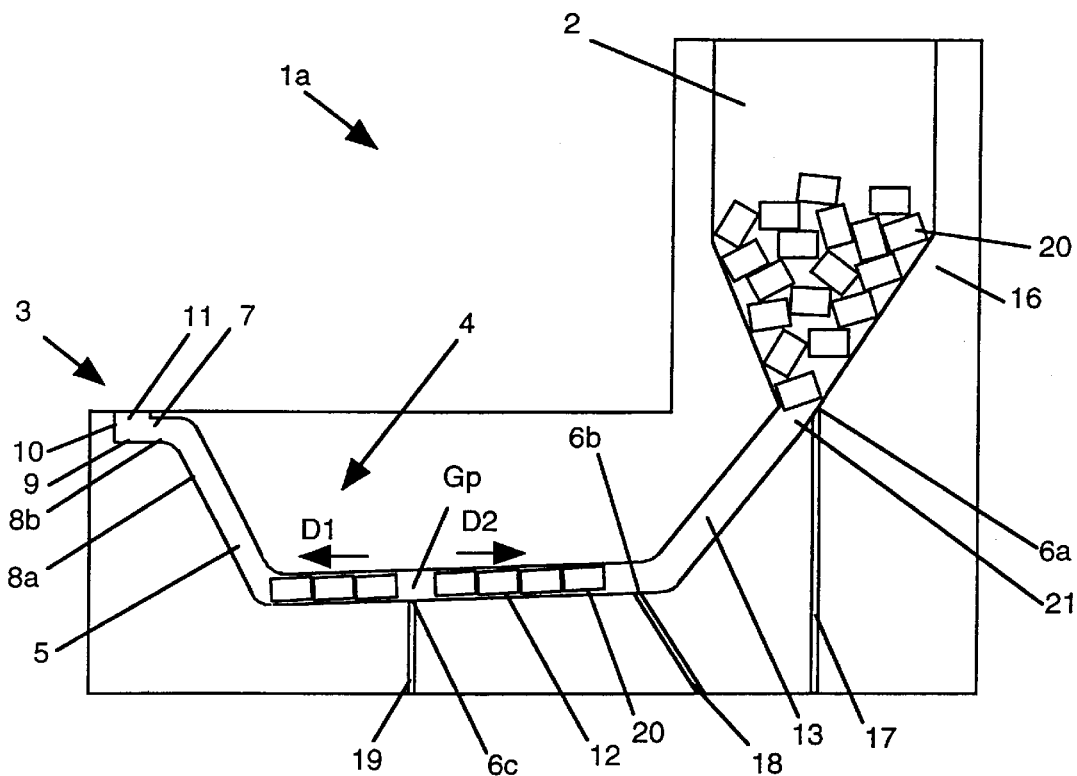
FIG. 1 is a side view of a preferred embodiment of a feeder in accordance with this invention.
Figure 2:
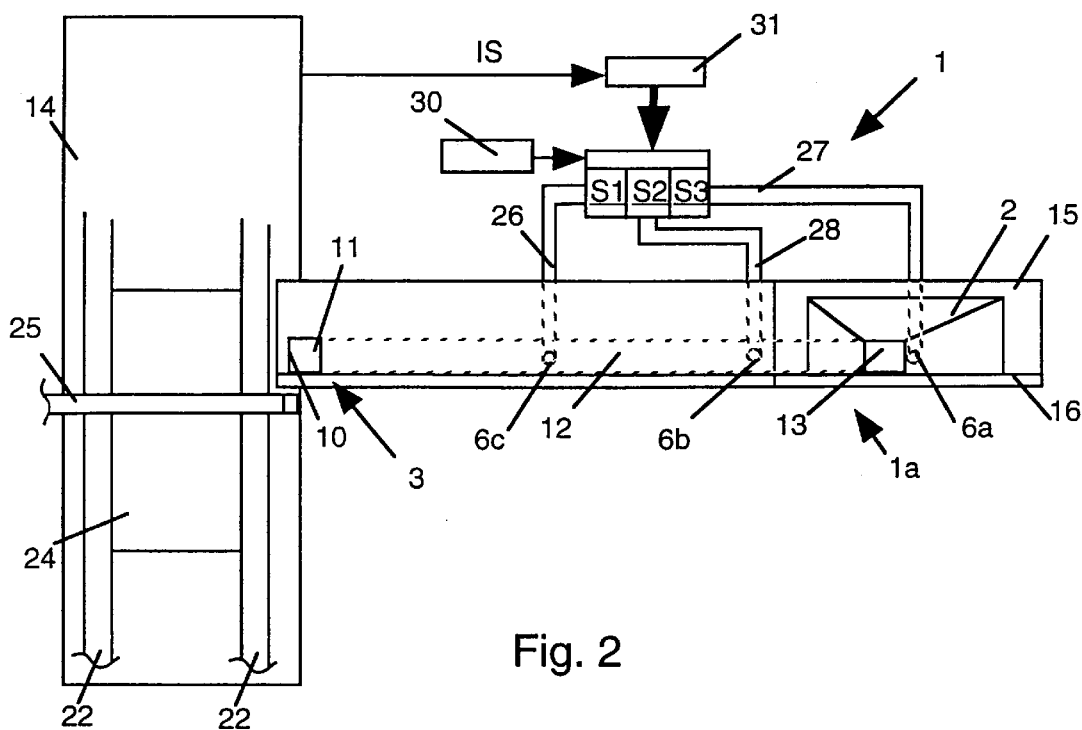
FIG. 2 is a plan view of the feeder of FIG. 1 when incorporated into a feeder system mounted adjacent a conveyor track of a pick and place machine.
Figure 3:
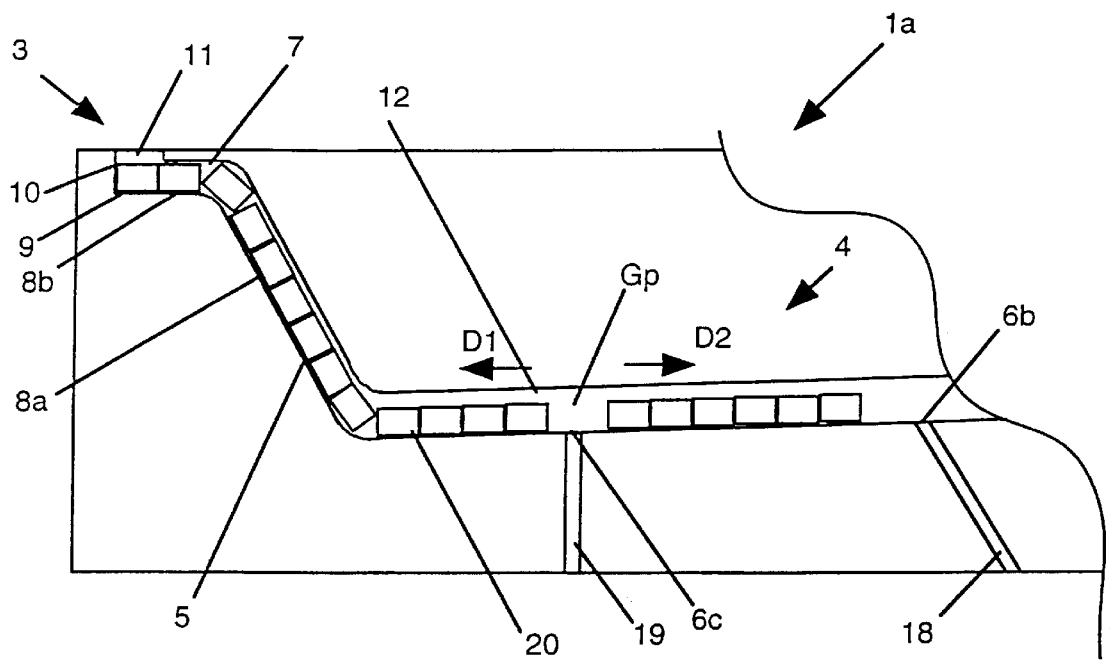
FIG. 3 illustrates the feeder of FIG. 1 in operation.

Referring to FIGS. 1 to 3 there is illustrated a feeder system 1 for supplying electrical components to pick-and-place machine. The feeder system 1 comprises a feeder 1a which includes a storage device in the form of a hopper 2, a pickup location 3 and a passage 4. The passage 4 provides communication between the hopper 2 and the pick up location 3 so that electrical components 20 in hopper 2 can transferred to the pickup location 3.

The passage 4 comprises an upwardly inclined portion 5 that is upwardly inclined towards the pickup location 3. The passage 4 has an intermediate portion 7 between the pickup location 3 and the upwardly inclined portion 5. The intermediate portion 7 has a component supporting surface 8b in a horizontal plane angled relative to a component supporting surface 8a of the upwardly inclined portion 5.

The pickup location 3 has a component supporting surface 9 that is aligned with surface 8b. There is also an abutment wall 10 for stopping and positioning the components 20 and an access aperture 11 for allowing removal of the components 20, by a pick-and-place machine 14 from the pickup location 3.

The passage 4 also has a first portion 12 and second portion 13 angled relative to each other. The second portion 13 is coupled at one end to an outlet 21 of the hopper 2 and at the other end to an end of the first portion 12. The other end of the first portion 12 is coupled to an end of the upwardly inclined portion 5 and the first portion 12 is angled relative to the upwardly inclined portion 5.

There is a first air outlet 6a located in hopper 2, adjacent the outlet 21, for agitating the components 20 in hopper 2 so that some of them will drop into the passage 4. There is a second air outlet 6b in passage 4 and a third air outlet 6c disposed in passage 4 between the pickup location 3 and the second air outlet 6b. There are air conduits 17, 18, 19 which allow for air to be supplied respectively to air outlets 6a, 6b, 6c. The passage 4, pickup location 3, hopper 2 and air conduits 17, 18, 19 are machined into a surface of a block 15 and enclosed by a transparent plate 16 that is glued and bolted to the block 15 (bolts not shown).

As specifically illustrated in FIG. 2, the conduits 17, 18, 19 are operatively coupled by respective solenoid valves S1, S2, S3 and flexible piping 26, 27, 28 to a pressurized air supply in the form of a compressor 30. There is also a controller 31 associated with the pick and place machine 14 to receive an index signal (IS) for use in selectively controlling the solenoid valves S1, S2, S3. As shown in FIG. 2, the feeder system 1 is located adjacent a conveyor track 22 of the pick-and-place machine 14. The conveyor track 22 is used to transport a printed circuit board 24 to a position near the pickup locations 3 so that a robot arm 25 can remove the components in the locations 3 via the access apertures 11. The robot arm 25 then places the components onto the board 24 in their required positions. Although only one feeder 1a of the feeder system 1 is illustrated, it will be apparent to a person skilled in the art that a plurality of feeders 1a can be mounted side by side and the conduits 17, 18, 19 of each feeder 1a would be coupled to further solenoid valves that are selectively controllable by controller 31.

Figure 4:
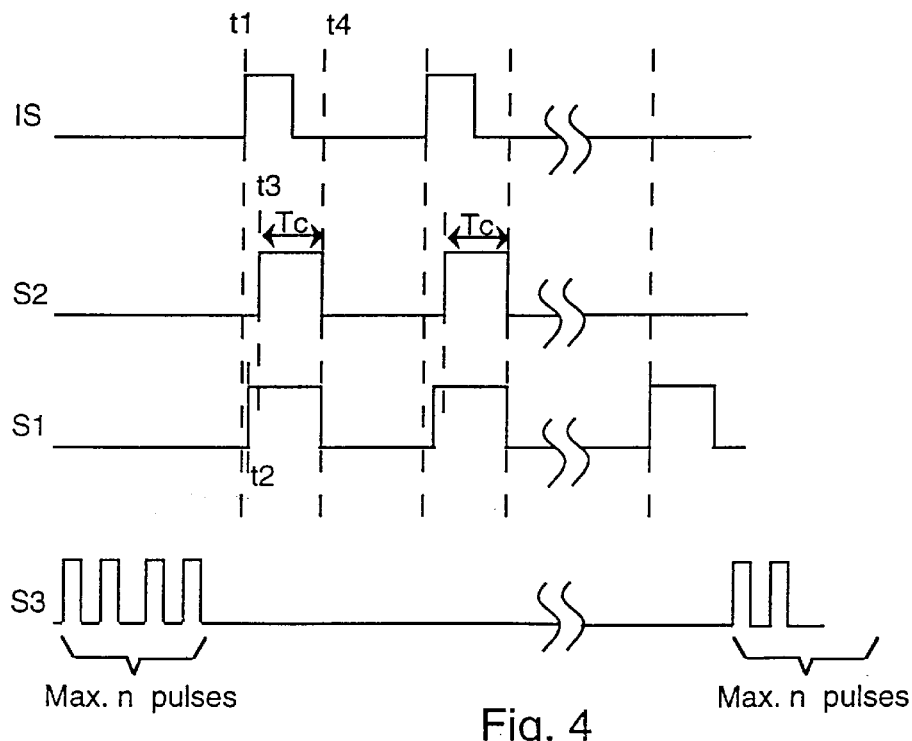
FIG. 4 illustrates a pulsed air sequence for use in the feeder system of FIG. 2

The operation of the feeder system 1 is explained with reference to FIG. 4. As illustrated, the controller 31 will control solenoid valve S3 to allow pulsed air blasts to be provided through first air outlet 6a thereby agitating the components 20 in hopper 2. Accordingly, after each air blast through first air outlet 6a one or more components 20 may drop through the outlet 21 into the passage 4. The solenoid valve S3 will be opened and closed until a maximum of n pulses (typically 20) have occurred or until an index signal (IS) is supplied from machine 14 to controller 31. When the index signal (IS) is received by controller 31, at time t1, this indicates that removal by arm 25 of one of the components 20 is required at pickup location 3. In response to the index signal (IS), the controller 31, at time t2, activates solenoid valve S1 thereby a pulsed air blast is supplied to the third air outlet 6c which pushes some components 20 towards the pickup location 3 as indicated by arrow D1 and some components towards hopper 2 as indicated by arrow D2. At time t3 controller 31 activates solenoid S2 thereby a pulsed air blast is supplied to the second air outlet 6b which has the effect of retaining some of the components between the third air outlet 6c and second air outlet 6b which are both concurrently supplied with an air blast for a time period TC. When time t4 occurs both solenoids S1 and S2 close resulting in the concurrent cessation of air blasts to air outlets 6b and 6c.

The air blast through air outlet 6c pushes some of the components 20 up the inclined portion 5. Further, if there is available space, a leading one of the components 20 in the queue will be pushed into the intermediate portion 7. However, if there is no available space in the intermediate portion 7, upon completion of an air blast through outlet 6c the components 20 will slide down the inclined portion 5 due to the effects of gravity. In this regard, the gap (Gp) has separated the stacked components 20 in the passage 4 into two groups which assists in allowing the components 20 to slide down the inclined portion 5. As a result, there is reduced friction between the abutment wall 10 and an abutting one of components 20, underneath the access aperture 11, which eases removal thereof by arm 25. This sequence is repeated every time an index signal (IS) is supplied to controller 31.

When there is no component located in pickup location 3, the next air blast through outlet 6c will push the leading one of the components into location 3. This leading component will abut wall 10 and be positioned underneath the access aperture 11 ready for removal by a pick-and-place machine. Further, if there is a component 20 located in the intermediate portion 7, this will push against, and assist in, maintaining positioning with relatively little friction of the leading component against the wall 10.

The present invention as described above advantageously limits the amount of friction of components 20 against the abutment wall 10 without the need for slotted disks and the like. Furthermore, because the third air outlet 6c and second air outlet 6b are concurrently supplied with an air blast, the components 20 between outlet 6b and 6c are retained therebetween and are not blown back into the hopper 2. Accordingly, relatively high component supply speeds can be obtained and the probability of components being available at the pickup location 3 can be improved.

Although this invention has been described with reference to a preferred embodiment, it is to be understood that the invention is not limited to the specific embodiment described herein. For instance, the robot arm 25 could be a carousel pickup mechanism and controller 31 could be incorporated into circuitry of the pick and place machine.

What is claimed is:

1. A feeder system for supplying electrical components to a pick-and-place machine, the feeder system comprising:
   at least one storage means for storing said components;
   a pickup location for supplying said components to said pick-and-place machine;
   a passage providing communication between said storage means and said pickup location;
   a first air outlet associated with said storage means for providing air blasts to agitate said components stored therein;
   a second air outlet located in a surface of said passage for providing air blasts to move said components along said passage towards said pickup location;
   a third air outlet located in a surface of said passage for providing air blasts, said third air outlet being disposed between said pickup location and said second air outlet;
   a pressurised air supply means operatively coupled to said first, second, and third outlets by respective valves; and
   a controller for selectively controlling said valves to concurrently supply air blasts to said second and third air outlets to thereby retain at least at least one of said components therebetween.

2. A feeder system as claimed in claim 1, wherein said controller selectively controls said valves such that said air blasts from said third air outlet will be effected immediately before said air blasts from said second air outlet is effected.

3. A feeder system as claimed in claim 1, wherein said controller selectively controls said valves such that pulsed said air blasts to said first air outlet occur only when there are no said air blasts being supplied from said second outlet.

4. A feeder system as claimed in claim 1, wherein said controller selectively controls said valves such that air blasts are concurrently supplied to said second and third air outlets when removal of one of said components from said pickup location is required.

5. A feeder system as claimed in claim 3, wherein said controller controls said valves to thereby concurrently cease supplying said air blasts from said second and third air outlets.

6. A feeder system as claimed in claim 5, wherein said passage comprises an inclined portion which is upwardly inclined towards said pickup location.

7. A feeder system as claimed in claim 6, wherein there is an intermediate portion of said passage between said pickup location and said upwardly inclined portion.

8. A feeder system as claimed in claim 7, wherein said intermediate portion has a component supporting surface angled relative to a component supporting surface of said upwardly inclined portion.

9. A method for supplying electrical components to a pick-and-place machine by a feeder system having a storage device coupled by a passage to a pickup location, the method comprising the steps of:

providing air blasts to a first air outlet associated with said storage device to agitate said components stored therein; and concurrently supplying air blasts to second and third air outlets located in a said passage to thereby retain at least one of said components therebetween, wherein said third air outlet is disposed between said pickup location and said second air outlet and said air blasts from said third air outlet is effected immediately before air blasts from said second outlet is effected.

10. A method as claimed in claim 9, wherein said air blasts from said second and third outlets are effected when said pick-and-place machine requires to remove one said component from said pickup location.

* * * * *